March 31, 1959 C. L. WANLASS 2,880,332
TRANSISTOR FLIP-FLOP CIRCUIT
Filed June 16, 1955
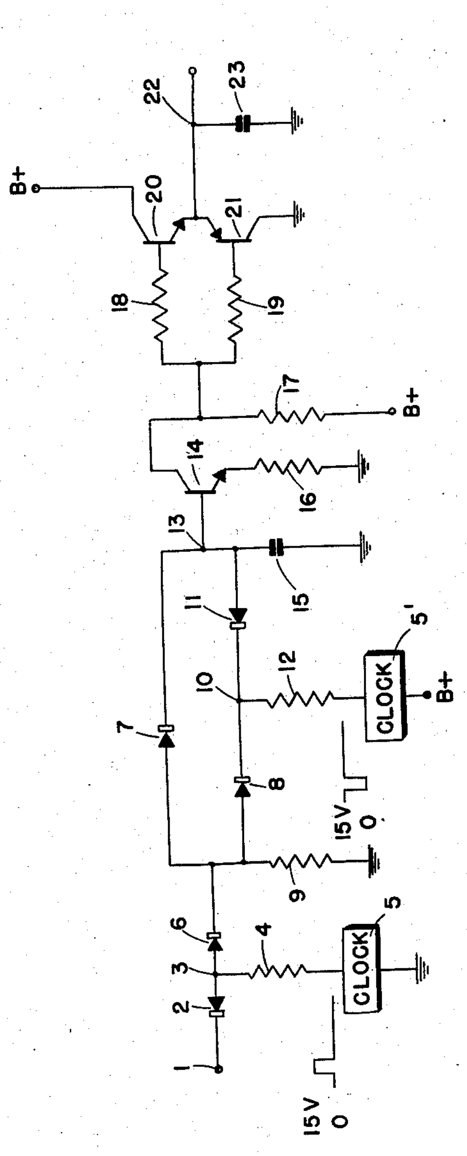
INVENTOR.
CRAVENS L. WANLASS
BY William R. Lane
ATTORNEY United States Patent Office 2,880,332

Patented Mar. 31, 1959

2,880,332

TRANSISTOR FLIP-FLOP CIRCUIT

Cravens L. Wanlass, Whittier, Calif., assignor to North American Aviation, Inc.

Application June 16, 1955, Serial No. 516,006

10 Claims. (Cl. 307—88.5)

This invention pertains to a flip-flop utilizing transistors.

Transistors offer several advantages over the use of electron tubes, namely, compactness, lower heat dissipation and lower power requirements. Where a very large number of such elements are required each one of these aspects can become an important consideration.

A flip-flop is an electronic device requiring a trigger pulse to provide an abrupt change from one output to a second output; and, in order to employ this output most advantageously, it is necessary that the impedance of the flip-flop and the circuit it drives be comparable. A transistor is inherently a low impedance device. It must, therefore, operate into a low impedance circuit. This invention provides this required low impedance load.

A nonconducting electronic tube held at cutoff by a control voltage exhibits high plate impedance. Spurious and transient effects do not readily operate to change the state of a flip-flop using such tubes. On the other hand, a transistor exhibits relatively low impedance even when nonconducting, and some means is necessary to provide reliable control over the conduction or nonconduction of each transistor, or what is the same, over the state of the flip-flop. The method of triggering the flip-flop is also important because such triggering method must operate to reliably initiate or terminate this state of the flip-flop. The device of the invention provides reliable control over the state of the flip-flop and continually reiterates the correct state.

The ordinary flip-flop dynamic circuit usually receives such a short-lived transient impulse that any transistor included in the circuit must, for best results, have fast transient properties. In the present stage of manufacture, transistors possessing fast transient properties are expensive and difficult to procure. The inherent capacity of a transistor interferes with its utility at high frequencies. This invention relieves of the requirement that transistors have good frequency response.

This invention proposes to utilize a storage capacitor and to maintain the storage capacitor charged in one direction or the other to represent the state of the flip-flop. This invention further proposes to regenerate the charge on said capacitor every clock pulse. Therefore, any error introduced transiently into the circuit is terminated upon the next clock pulse when the output is regenerated.

It is therefore an object of this invention to provide a transistor flip-flop circuit having low output impedance.

It is another object of this invention to provide a transistor flip-flop circuit having improved frequency characteristics.

It is still another object of this invention to provide a transistor flip-flop circuit in which information is regenerated every clock pulse.

A still further object of this invention is to provide a transistor flip-flop circuit in which the charge across a capacitor represents the state of the flip-flop.

Another object of this invention is to provide a transistor flip-flop circuit which charges a first capacitor in order to control the charge on an output storage capacitor.

Other objects of the invention will become apparent from the following description taken in connection with the accompanying single figure which is an electrical schematic.

The input is received at terminal 1, at the cathode of diode 2, which is connected to point 3 connected through resistor 4 to clock source 5 which, in turn, is connected to ground. Also connected to point 3 is diode 6 whose cathode is connected to diodes 7 and 8 and through resistor 9 to ground. The cathode of diode 8 is connected to point 10 which, in turn, is connected to diode 11 and through resistor 12 to clock source 5' which, in turn, is connected to the B+ supply. The diodes 11 and 7 are connected to point 13 which is connected to the base of transistor 14 and to first storage capacitor 15 which, in turn, is connected to ground. The collector of transistor 14 is connected through resistor 16 to ground. The emitter is connected through resistors 17 to B+. The emitter of transistor 14 is also connected through resistors 18 and 19 to the bases of transistors 20 and 21, respectively. The collectors of transistors 20 and 21 are connected together to point 22 which is connected to capacitor 23. The emitter of transistor 20 is connected to B+. The emitter of transistor 21 is connected to ground. Capacitor 23 is also connected to ground.

Clock source 5 provides a positive pulse of, for example, 15 volts to resistor 4 and clock source 5' provides a negative-going pulse of 15 volts to resistor 12. Sources 5 and 5' may be a single source providing complementary pulses simultaneously or two separate, synchronized sources.

Assuming the input voltage to point 1 is false (the low voltage state) and a clock pulse appears, the voltage at point 3 stays at a low potential. Diode 6, then, does not conduct and its cathode remains at approximately ground potential along with the anodes of diodes 7 and 8 which, likewise, do not conduct. Clock 5' provides a negative pulse to point 10 causing diode 11 to conduct, placing a negative potential at point 13 across capacitor 15 which cuts off transistor 14 from conduction. Upon nonconduction of transistor 14, its emitter rises in potential and raises the base voltage of transistors 20 and 21 through resistors 18 and 19. Transistor 20 is thus biased to conduction and transistor 21 is biased to nonconduction. Point 22 rises in potential, and B+ voltage is placed across capacitor 23. The output at terminal 22 is, then, a high voltage when the input to terminal 1 is a low voltage.

Assuming the next case in which the input signal to terminal 1 is a high voltage, diode 2 does not conduct and upon the clock pulse, point 3 rises in potential and diode 6 is allowed to conduct, raising the anode potential of diodes 7 and 8, both of which are allowed to conduct. As point 10 rises in potential with the conduction of diode 8, diode 11 is biased to nonconduction and diode 7 is biased to conduction, placing a high potential on point 13 which causes transistor 14 to conduct. The emitter of transistor 14 drops in potential and biases the base of transistor 20 to cutoff and transistor 21 to conduction, which acts to remove any charge across capacitor 23, consequently, the output at terminal 22 is ground potential, or low voltage, for a high voltage input at terminal 1.

It will be noted that at every clock pulse, an output will be received at terminal 22 according to the input to terminal 1. This is obtained by reason of the circuitry and the complementary clock pulse sources 5 and 5' and the gating provided by the diodes according to the input signal.

By reason of the oppositely-conducting transistor 20, which is N–P–N type, and 21, which is P–N–P type, capacitor 23 is charged according to the desired signal or discharged according to the desired signal. Information is gated through the device (a whole computer, for example) upon each pulse of the clock source. The clock pulses are several pulse widths apart, which allows ample time for capacitors 15 and 23 to be charged or discharged. Thus, high-frequency characteristics are not required of the transistors. The capacitor 23 serves as a satisfactory storage device and converts this circuit into a flip-flop. Every clock pulse, information is regenerated, or reiterated, by recharging or discharging the capacitor to place it in a particular state according to the input information. The capacitor 15 acts as smaller, quick-response storage device controlling transistor 14. Capacitor 23 acts as a power amplifier since its capacity is usually a thousand or more times that of capacitor 15.

This circuit includes two novel characteristics. The use of capacitor 15 as a storage device, permits the circuit to hold its information for a relatively long time. Also, the input circuitry is so designed that the information stored in capacitor 15 is either regenerated or changed every clock pulse. Therefore, any error independent of the flip-flop output introduced into the circuit fails to persist for longer than one interval between clock pulses.

The benefit from the first innovation is that the transistors 14, 20 and 21 do not need high-frequency characteristics. The information storage device is a passive element, capacitor 15, and the transistors have the time interval between successive clock pulses to perform their function in the circuit according to the control by capacitor 15. If successive clock pulses are spaced several pulse widths apart, sufficient time elapses for each transistor to conduct enough current to perform its functions.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A flip-flop circuit comprising a first capacitor, means for establishing a charge across said capacitor, a pair of oppositely-conductive type transistors whose control elements are connected to be controlled by the charge on said capacitor and a second capacitor connected to said pair of transistors so as to be charged according to the conduction thereof.

2. The combination recited in claim 1 wherein said first capacitor is relatively smaller than said second capacitor.

3. A reiterative flip-flop circuit comprising, a clock pulse source, a first capacitor, gating means connecting said clock pulse source and said capacitor, said gating means adapted to receive an input signal and cause said capacitor to become charged to a value determined by said clock pulse source according to said input signal, amplifying means responsive to the charge on said capacitor, a pair of oppositely-conductive type transistors whose control elements are connected to be controlled by said first capacitor, a second capacitor connected to be charged according to the conduction of said pair of transistors.

4. A reiterative gating system comprising a clock source providing simultaneous complementary pulses, a first capacitor, gating means connecting said capacitor and said clock source, said gating means adapted to receive an input signal and operative to place a charge from said clock pulse source on said capacitor in accordance with said clock pulse or said complementary clock pulse depending on the input signal to said gating means, amplifying means responsive to the charge on said capacitor, a pair of oppositely-conductive type transistors whose control elements are connected to be controlled by said amplifying means, and a capacitor connected to said pair of transistors so as to be charged according to the conduction thereof.

5. A transistor flip-flop comprising a first capacitor, a clock pulse source providing more positive and more negative pulses simultaneously, diode gating means connected to gate at any one time one of the more negative or more positive pulse outputs provided by said clock pulse source to said capacitor, said diode gating means adapted to receive an input signal and allow said capacitor to become charged to the value of one of said more positive or more negative pulses provided by said clock pulse source according to said input signal, a second capacitor, electronic valve means controlled by the charge on said first capacitor, said electronic valve means connected to charge and discharge said second capacitor according to the charge on said first capacitor.

6. The combination recited in claim 5 wherein said second capacitor is at least several times the capacitance of said first capacitor, and wherein said electronic valve means comprises a first electronic valve connected to charge said second capacitor in response to one of the more positive pulses and the more negative pulses and said second electronic valve is connected to discharge said capacitor in response to the other of the more positive and the more negative pulses.

7. A transistor flip-flop comprising a first capacitor, a clock pulse source providing positive and negative pulses simultaneously, diode gating means connecting said clock pulse source and said capacitor, said diode gating means adapted to receive an input binary signal and allow said capacitor to become charged by said clock pulse source according to said input signal, a second capacitor, amplifying means connected to be controlled by the voltage across said first capacitor, a pair of oppositely-conductive type transistors connected in series, the control elements of said transistors connected to be controlled by the output of said amplifying means, a capacitor connected intermediate said transistors so as to be charged by one of said pair of transistors and discharged by the other.

8. In a reiterative flip-flop, a first capacitor, a clock pulse source providing positive and negative pulses simultaneously, diode gating means connecting said clock pulse source to said first capacitor and adapted to receive an input signal and gate a positive or a negative pulse from said clock source to said capacitor in accordance with said input signal, amplifying means connected to be controlled by the charge on said capacitor, a second capacitor, an N–P–N transistor and a P–N–P transistor whose control elements are connected to be controlled by said amplifying means, one of said transistors connected to charge said capacitor, and the other of said transistors connected to discharge said capacitor.

9. In a reiterative flip-flop, a first capacitor, a clock pulse source providing positive and negative pulses simultaneously, diode gating means connecting said clock pulse source to said first capacitor and adapted to receive an input signal and gate said positive or negative pulses to said capacitor, a first transistor whose control element is connected to be controlled by the charge across said capacitor, an N–P–N transistor whose control element is connected to be controlled by said first transistor, a power source connected to the collector of said N–P–N transistor, a P–N–P transistor connected to be controlled in its conduction by said first transistor, the emitter of said P–N–P transistor connected to the emitter of said N–P–N transistor and the collector of said P–N–P transistor connected to ground, a second capacitor connected on one side of the emitters of said transistors and on the other side to ground.

10. In a reiterative flip-flop, a first capacitor, a clock pulse source providing more positive and more negative pulses simultaneously, diode gating means connecting said clock pulse source to said first capacitor and adapted to receive an input signal and gate said positive and negative pulses to said capacitor according to said input signal, a first transistor whose control element is connected to be controlled by the charge across said capacitor, an N–P–N transistor connected to be controlled in its conduction by said first transistor, a P–N–P transistor connected to be controlled in its conduction by said first transistor, a power source, a second capacitor, one of said N–P–N transistor and P–N–P transistor connected to provide a charge path from said power source to said second capacitor, the other of said N–P–N transistor and said P–N–P transistor connected to provide a discharge path for said second capacitor whereby said second capacitor is charged and discharged according to the charge on said first capacitor.

References Cited in the file of this patent

UNITED STATES PATENTS

| | | |
|---|---|---|
| 2,335,265 | Dodington | Nov. 30, 1943 |
| 2,466,705 | Hoeppner | Apr. 12, 1949 |
| 2,500,536 | Goldberg | Mar. 14, 1950 |
| 2,531,600 | Barney et al. | Nov. 28, 1950 |
| 2,576,026 | Meacham | Nov. 20, 1951 |
| 2,663,800 | Herzog | Dec. 22, 1953 |
| 2,750,500 | Aiken | June 12, 1956 |

UNITED STATES PATENT OFFICE

CERTIFICATE OF CORRECTION

Patent No. 2,880,332 March 31, 1959

Cravens L. Wanlass

It is hereby certified that error appears in the printed specification of the above numbered patent requiring correction and that the said Letters Patent should read as corrected below.

Column 4, line 67, for "of", first occurrence, read -- to --.

Signed and sealed this 3rd day of November 1959.

(SEAL)
Attest:

KARL H. AXLINE
Attesting Officer

ROBERT C. WATSON
Commissioner of Patents